(12) United States Patent
Ogata

(10) Patent No.: US 10,714,526 B2
(45) Date of Patent: Jul. 14, 2020

(54) SOLID-STATE IMAGING DEVICE, MANUFACTURING METHOD THEREOF, AND ELECTRONIC APPARATUS

(71) Applicant: Sony Corporation, Tokyo (JP)

(72) Inventor: Yosuke Ogata, Kumamoto (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/291,889

(22) Filed: Mar. 4, 2019

(65) Prior Publication Data

US 2019/0198551 A1 Jun. 27, 2019

Related U.S. Application Data

(63) Continuation of application No. 15/409,958, filed on Jan. 19, 2017, now Pat. No. 10,256,268, which is a (Continued)

(30) Foreign Application Priority Data

Dec. 13, 2013 (JP) .................................. 2013-257917

(51) Int. Cl.
*H01L 27/146* (2006.01)
*H01L 23/00* (2006.01)
(Continued)

(52) U.S. Cl.
CPC ........ *H01L 27/14634* (2013.01); *H01L 24/48* (2013.01); *H01L 24/73* (2013.01); *H01L 25/167* (2013.01); *H01L 25/50* (2013.01); *H01L 27/1469* (2013.01); *H01L 27/14618* (2013.01); *H01L 27/14683* (2013.01); *H01L 2224/48095* (2013.01); *H01L 2224/48227* (2013.01); *H01L 2224/48465* (2013.01); *H01L 2224/73215* (2013.01); *H01L 2224/73265* (2013.01); *H01L 2224/97* (2013.01); *H01L 2924/00014* (2013.01); *H01L 2924/181* (2013.01);
(Continued)

(58) Field of Classification Search
CPC .......... H01L 27/14634; H01L 27/1469; H01L 27/14618; H01L 27/14683; H01L 2224/97; H01L 2924/00014
See application file for complete search history.

(56) References Cited

U.S. PATENT DOCUMENTS 7,157,742 B2 * 1/2007 Badehi .............. H01L 31/02164
257/81
7,274,094 B2 * 9/2007 Boon .................. H01L 31/0203
257/433
(Continued)

*Primary Examiner* — Tony Ko
(74) *Attorney, Agent, or Firm* — Sheridan Ross P.C.

(57) ABSTRACT

Disclosed is a solid-state imaging device including: a solid-state imaging element which outputs an image signal according to an amount of light sensed on a light sensing surface; a semiconductor element which performs signal processing with respect to the image signal output from the solid-state imaging element; and a substrate which is electrically connected to the solid-state imaging element and the semiconductor element, in which the semiconductor element is sealed by a molding resin in a state of being accommodated in an accommodation area which is provided on the substrate, and in which the solid-state imaging element is layered on the semiconductor element via the molding resin.

20 Claims, 5 Drawing Sheets

Related U.S. Application Data continuation of application No. 14/563,457, filed on Dec. 8, 2014, now Pat. No. 9,553,125.

(51) Int. Cl.
*H01L 25/16* (2006.01)
*H01L 25/00* (2006.01)
*H04N 5/225* (2006.01)

(52) U.S. Cl.
CPC ............... *H01L 2924/1815* (2013.01); *H01L 2924/18165* (2013.01); *H04N 5/2257* (2013.01)

(56) References Cited

U.S. PATENT DOCUMENTS 7,893,514 B2 * 2/2011 Kwon ............... H01L 27/14618
257/433
9,276,030 B2 * 3/2016 Dixon ............... H01L 27/14636

* cited by examiner

SOLID-STATE IMAGING DEVICE, MANUFACTURING METHOD THEREOF, AND ELECTRONIC APPARATUS

CROSS REFERENCE TO RELATED APPLICATIONS

This application is a continuation of U.S. Pat. No. 15/409,958, filed Jan. 19, 2017, which is a continuation of U.S. patent application Ser. No. 14/563,457, filed Dec. 8, 2014, now U.S. Pat. No. 9,553,125, which claimed the benefit of Japanese Priority Patent Application JP 2013-257917 filed Dec. 13, 2013, the entire contents of each of which are hereby incorporated herein by reference. This application is related to U.S. patent application Ser. No. 15/432,630, filed Feb. 14, 2017, now U.S. Pat. No. 9,887,223, which is a continuation of U.S. patent application Ser. No. 15/409,958, the entire contents of which is hereby incorporated herein by reference.

BACKGROUND

The present disclosure relates to a solid-state imaging device, a manufacturing method thereof, and an electronic apparatus, and particularly relates to a solid-state imaging device which can be made much thinner, a manufacturing method thereof, and an electronic apparatus.

In the related art, the electronic apparatus, such as a mobile phone or a smart phone, is provided with the solid-state imaging device, such as a charge coupled device (CCD) or a complementary metal oxide semiconductor (CMOS) sensor, and has a capturing function which captures an image. In addition, in recent years, as the electronic apparatus has become smaller and multi-functionalized, there has been suggested a structure in which the solid-state imaging device that captures the image and outputs an image signal and a semiconductor element that performs signal processing with respect to the image signal are accommodated in the same package.

For example, in Japanese Unexamined Patent Application Publication No. 2004-6564, a multilayer type semiconductor device, which is configured by a layered structure in which the semiconductor element is installed on a substrate and the solid-state imaging element is fixed via a heat insulating layer on an upper surface of the semiconductor element, is disclosed.

SUMMARY

However, after that, if there has been assumed a further reduced size of an electronic apparatus, a solid-state imaging device is necessary which is configured by a much thinner layered structure than a layered structure disclosed in Japanese Unexamined Patent Application Publication No. 2004-6564.

The present disclosure is made in view of such circumstances and can further reduce a thickness of the apparatus.

According to an embodiment of the present disclosure, there is provided a solid-state imaging device including: a solid-state imaging element which outputs an image signal according to an amount of light sensed on a light sensing surface; a semiconductor element which performs signal processing with respect to the image signal output from the solid-state imaging element; and a substrate which is electrically connected to the solid-state imaging element and the semiconductor element. The semiconductor element is sealed by a molding resin in a state of being accommodated in an accommodation area which is provided on the substrate. The solid-state imaging element is layered on the semiconductor element via the molding resin.

According to another embodiment of the present disclosure, there is provided a manufacturing method of a solid-state imaging device which has: a solid-state imaging element which outputs an image signal according to an amount of light sensed on a light sensing surface; a semiconductor element which performs signal processing with respect to the image signal output from the solid-state imaging element; and a substrate which is electrically connected to the solid-state imaging element and the semiconductor element. The manufacturing method includes: sealing the semiconductor element using a molding resin in a state of being accommodated in an accommodation area which is provided on the substrate; and layering the solid-state imaging element on the semiconductor element via the molding resin.

According to still another embodiment of the present disclosure, there is provided an electronic apparatus including a solid-state imaging device that includes: a solid-state imaging element which outputs an image signal according to an amount of light sensed on a light sensing surface; a semiconductor element which performs signal processing with respect to the image signal output from the solid-state imaging element; and a substrate which is electrically connected to the solid-state imaging element and the semiconductor element. The semiconductor element is sealed by a molding resin in a state of being accommodated in an accommodation area which is provided on the substrate. The solid-state imaging element is layered on the semiconductor element via the molding resin.

In the embodiment, the semiconductor element is sealed by the molding resin in a state of being accommodated in the accommodation area which is provided on a substrate, and the solid-state imaging element is layered on the semiconductor element via the molding resin.

In this case, it is possible to further reduce a thickness.

DETAILED DESCRIPTION OF EMBODIMENTS

Hereinafter, specific embodiments which employ the present technology will be described with reference to the drawings.

Figure 1:
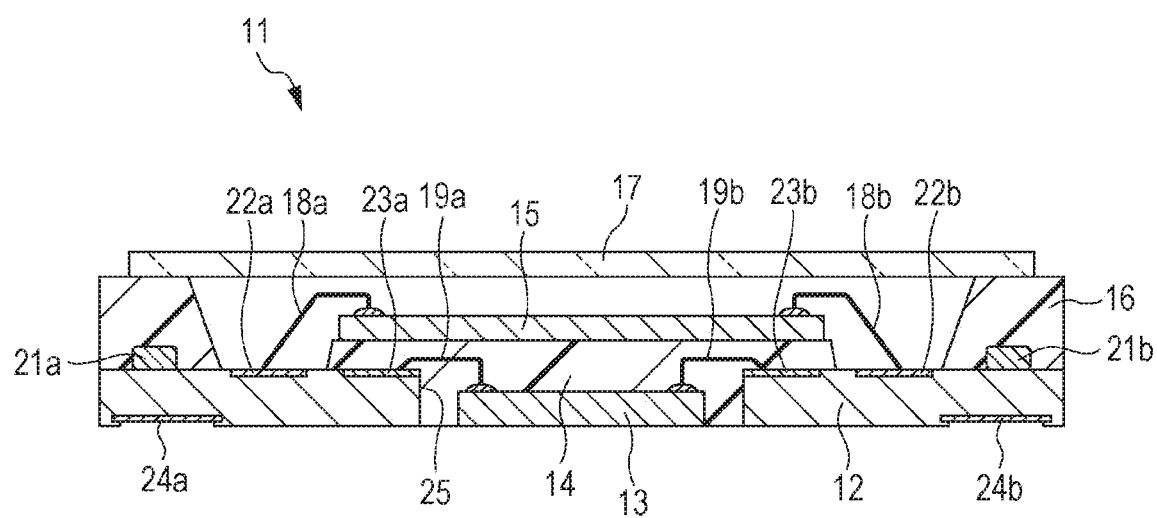
FIG. 1 is a view illustrating a configuration example of a first embodiment of a solid-state imaging device which employs the present technology.

FIG. 1 is a view illustrating a configuration example of a first embodiment of a solid-state imaging device which employs the present technology.

In FIG. 1, a cross-sectional configuration example of a solid-state imaging device 11 is illustrated. The solid-state imaging device 11 is provided with an organic substrate 12, a semiconductor element 13, a molding resin 14, a solid-state imaging element 15, a molding resin 16, and a seal glass 17. In addition, in the solid-state imaging device 11, the organic substrate 12 and the solid-state imaging element 15 are electrically connected to each other via bonding wires 18a and 18b. The organic substrate 12 and the semiconductor element 13 are electrically connected to each other via bonding wires 19a and 19b.

The organic substrate 12 is electrically connected to the semiconductor element 13 and the solid-state imaging element 15, and a wiring is formed on the inside thereof. Here, a surface which faces an upper side of FIG. 1 is referred to as a front surface of the organic substrate 12, and a surface which faces a lower side of FIG. 1 is referred to as a rear surface of the organic substrate 12.

On the front surface of the organic substrate 12, for example, chip components 21a and 21b which are electronic components, such as a capacitor or a resistor, are mounted. Furthermore, on the rear surface of the organic substrate 12, inner leads 22a and 22b which are respectively connected to the bonding wires 18a and 18b, and inner leads 23a and 23b which are respectively connected to the bonding wires 19a and 19b, are formed. In addition, on the rear surface of the organic substrate 12, mounting terminals 24a and 24b which are used for a connection with an electronic apparatus (not illustrated) that has the solid-state imaging device 11 mounted thereon, are formed.

On the organic substrate 12, a penetration portion 25 is formed to penetrate the organic substrate 12. The penetration portion 25 is formed in a size that can accommodate the semiconductor element 13, and is an accommodation area which accommodates the semiconductor element 13.

The semiconductor element 13 is provided with a function as a signal processing circuit which performs image processing with respect to an image signal output from the solid-state imaging element 15, for example. The semiconductor element 13 is sealed by the molding resin 14 in a state of being accommodated in the penetration portion 25 which is formed on the organic substrate 12. A part of the semiconductor element 13, or at least a rear surface of the semiconductor element 13 as illustrated in the drawing, is exposed on the rear surface side of the organic substrate 12. In addition, a thickness of the semiconductor element 13 is equal to or less than a thickness of the organic substrate 12.

The molding resin 14 is a resin for sealing the semiconductor element 13. In addition, an upper surface of the molding resin 14 is formed to be flat. On the upper surface of the molding resin 14, the solid-state imaging element 15 is disposed via a spacer (not illustrated).

The solid-state imaging element 15 has a light sensing surface on which a plurality of pixels is planarly disposed. For example, the solid-state imaging element 15 senses light irradiated on the light sensing surface via an optical system 53 of FIG. 6 which will be described later, and outputs the image signal according to an amount of light sensed by each pixel. In addition, the solid-state imaging element 15 is layered on the semiconductor element 13 via the molding resin 14.

The molding resin 16 is a resin which seals the chip components 21a and 21b or the like that are mounted on the front surface of the organic substrate 12, and is formed at a predetermined height (thickness) to be higher than the bonding wires 18a and 18b.

The seal glass 17 is fixed to the molding resin 16 to cover the light sensing surface of the solid-state imaging element 15, and airtightly seals a space in which the solid-state imaging element 15 is disposed.

As the semiconductor element 13 is accommodated in the penetration portion 25 of the organic substrate 12, the solid-state imaging device 11 having this configuration can reduce a thickness of a package even when a layered structure in which the semiconductor element 13 and the solid-state imaging element 15 are layered is employed.

In addition, in the solid-state imaging device 11, by this layered structure, a height distance (downward height) of the bonding wires 18a and 18b from the solid-state imaging element 15 to the organic substrate 12 can be shorter than that in the related art, as much as the thickness of the semiconductor element 13. Furthermore, a downward angle of the bonding wires 18a and 18b can be eased more than that in the related art. Accordingly, it is possible to improve reliability and bonding strength of the wire bonding which uses the bonding wires 18a and 18b.

Furthermore, in the solid-state imaging device 11, by the configuration in which the rear surface of the semiconductor element 13 is exposed on the rear surface side of the organic substrate 12, it is easy to ensure a radiating path of heat generated by the semiconductor element 13. Accordingly, it is possible to suppress an increase in temperature of the solid-state imaging element 15. For example, in the solid-state imaging device 11, it is possible to directly attach a heat-radiating plate (not illustrated) to the semiconductor element 13. Furthermore, as the semiconductor element 13 and the solid-state imaging element 15 are layered via the molding resin 14, it is possible to avoid a direct transfer of the heat generated from the semiconductor element 13 to the solid-state imaging element 15. In addition, it is preferable that the molding resin 14 have a much lower thermal conductivity.

In this manner, as heat radiation of the semiconductor element 13 is performed well, and heat transfer from the semiconductor element 13 to the solid-state imaging element 15 is suppressed, it is possible to avoid the increase in temperature of the solid-state imaging element 15, for example, to reduce deterioration of image quality by suppressing a generation of a noise.

In addition, in the configuration example of FIG. 1, the penetration portion 25 which penetrates the organic substrate 12 is the accommodation area which accommodates the semiconductor element 13. However, the accommodation area which accommodates the semiconductor element 13 may not necessarily penetrate the organic substrate 12. For example, even in a configuration in which a concave portion is formed on the organic substrate 12 and the semiconductor element 13 is accommodated in the concave portion, it is possible to reduce the thickness as described above.

Figure 2:
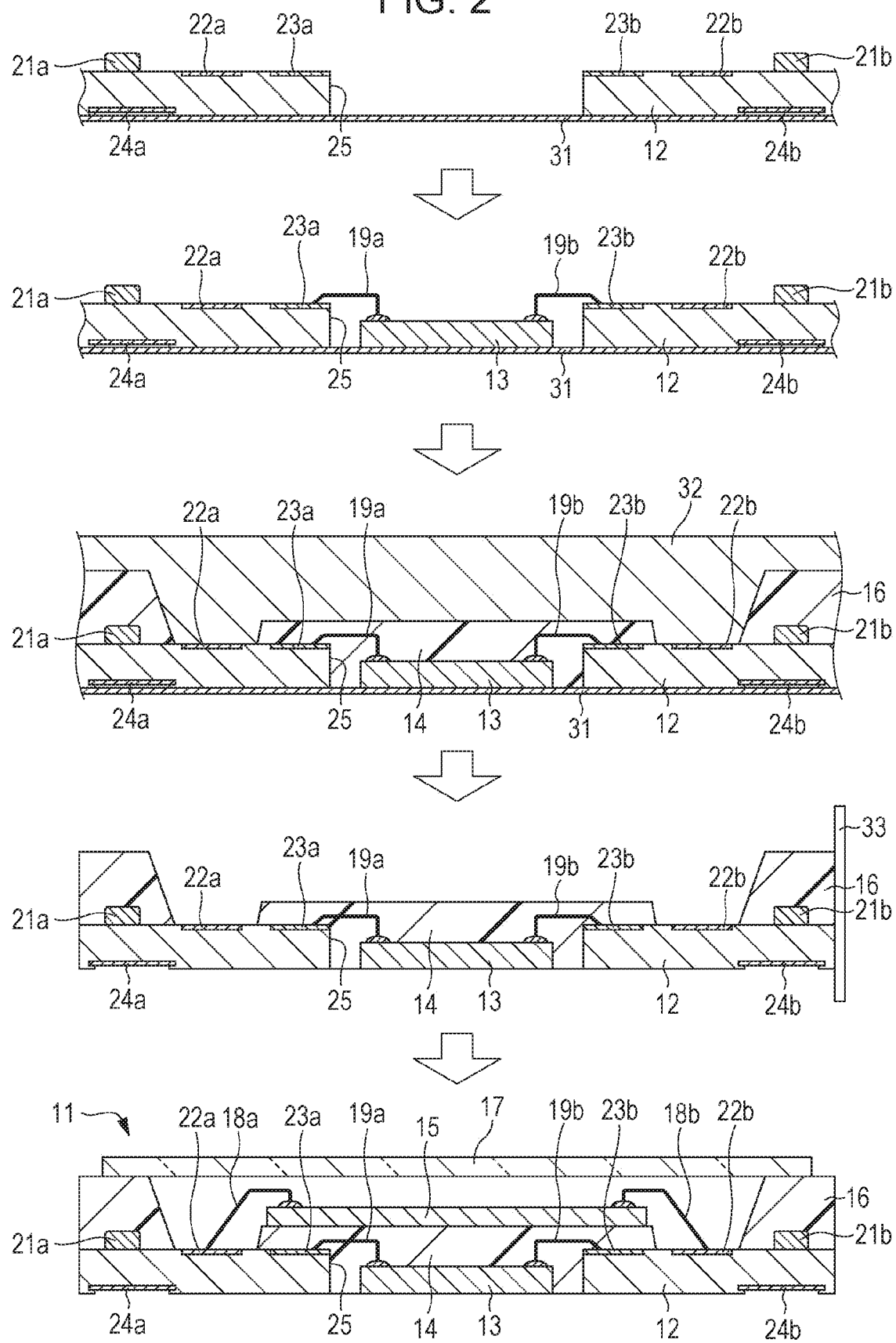
FIG. 2 is a view illustrating a manufacturing method of the solid-state imaging device.

Next, a manufacturing method of the solid-state imaging device 11 will be described with reference to FIG. 2.

First, in a first step, after mounting the chip components 21a and 21b or the like on the front surface of the organic substrate 12 on which the penetration portion 25 is formed in advance, a heat-resistance tape 31 (for example, a polyimide adhesive tape) having heat resistance and an insulating property is stuck to the rear surface of the organic substrate 12. The heat-resistance tape 31 is a foundation for disposing the semiconductor element 13 in the penetration portion 25 which is formed on the organic substrate 12.

Next, in a second step, the semiconductor element 13 is fixed to the heat-resistance tape 31. At this time, for example, it is possible to fix the semiconductor element 13 to the heat-resistance tape 31 by using a die bond material. It is possible to fix the semiconductor element 13 to the heat-resistance tape 31 by applying an adhesive to the heat-resistance tape 31 in advance. After that, the organic substrate 12 and the semiconductor element 13 are electrically connected to each other by the bonding wires 19a and 19b.

Next, in a third step, by using a mold 32, the molding resin 14 and the molding resin 16 are molded at the same time. Accordingly, as the semiconductor element 13 is sealed by the molding resin 14, the chip components 21a and 21b are sealed by the molding resin 16.

Next, in a fourth step, the heat-resistance tape 31 is detached from the rear surface of the organic substrate 12, and a dicing (separating) is performed by a dicing blade 33. At this time, as the heat-resistance tape 31 is detached, the rear surface of the semiconductor element 13 is exposed on the rear surface side of the organic substrate 12.

Next, in a fifth step, as the solid-state imaging element 15 is placed on the molding resin 14, the layered structure has a configuration in which the semiconductor element 13 and the solid-state imaging element 15 are layered via the molding resin 14. After that, the organic substrate 12 and the solid-state imaging element 15 are electrically connected to each other via the bonding wires 18a and 18b. As the seal glass 17 is fixed to the molding resin 16, the space in which the solid-state imaging element 15 is disposed is airtightly sealed.

According to the steps, the semiconductor element 13 is sealed by the molding resin 14 in a state of being accommodated in the penetration portion 25, and it is possible to manufacture the solid-state imaging device 11 in which the semiconductor element 13 and the solid-state imaging element 15 are layered via the molding resin 14.

In addition, in the manufacturing method, by using an aggregate substrate which can cut out a plurality of solid-state imaging devices 11, after performing the dicing by the dicing blade 33, the solid-state imaging element 15 and the seal glass 17 are fixed. In contrast, for example, after fixing the solid-state imaging element 15 and the seal glass 17, the dicing may be performed by the dicing blade 33.

In other words, with reference to FIG. 3, another manufacturing method of the solid-state imaging device 11 will be described.

Figure 3:
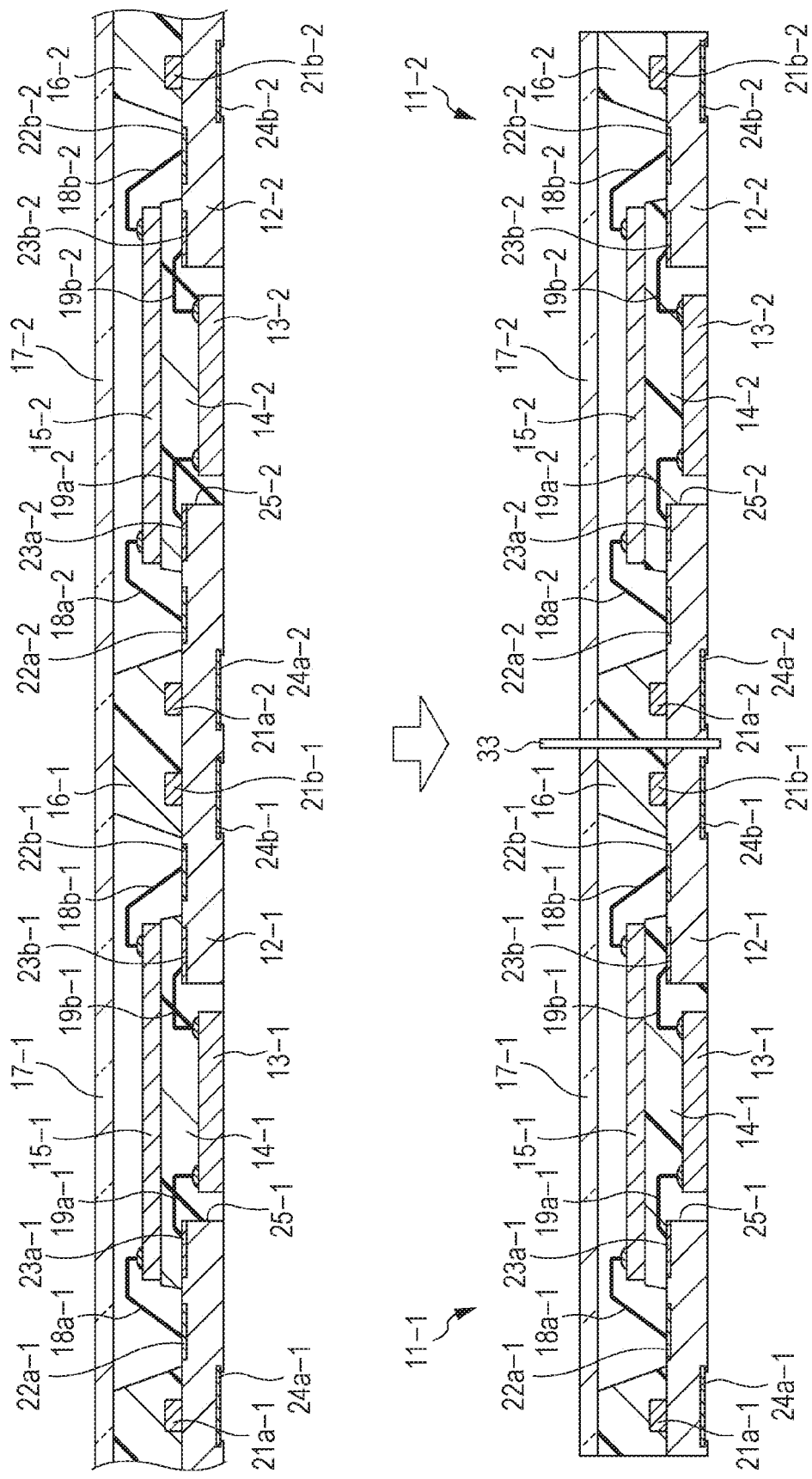
FIG. 3 is a view illustrating another manufacturing method of the solid-state imaging device.

In FIG. 3, in a configuration in which the aggregate substrate that can cut out the plurality of solid-state imaging devices 11 is used, two adjacent solid-state imaging device 11-1 and solid-state imaging device 11-2 are illustrated.

In addition, the solid-state imaging device 11-1 and the solid-state imaging device 11-2 are configured similarly to each other, and each portion which configures each of the solid-state imaging device 11-1 and the solid-state imaging device 11-2 are given the same reference numerals. In addition, as described above with reference to FIG. 2, until the third step, the aggregate substrate is manufactured, molding resins 14-1 and 14-2 and molding resins 16-1 and 16-2 are molded by using the mold 32, and the heat-resistance tape 31 is detached from the rear surface of organic substrates 12-1 and 12-2 which are integrated as one body.

As illustrated on the upper side of FIG. 3, solid-state imaging elements 15-1 and 15-2 are placed on the molding resins 14-1 and 14-2. Furthermore, the organic substrate 12-1 and the solid-state imaging element 15-1 are electrically connected to each other by bonding wires 19a-1 and 19b-1, and the organic substrate 12-2 and the solid-state imaging element 15-2 are electrically connected to each other by bonding wires 19a-2 and 19b-2. In addition, seal glasses 17-1 and 17-2 which are integrated as one body are fixed to the molding resins 16-1 and 16-2.

After that, as illustrated on the lower side of FIG. 3, by the dicing blade 33, the solid-state imaging device 11 is diced (separated) into the solid-state imaging device 11-1 and the solid-state imaging device 11-2.

As the steps are employed, it is possible to improve efficiency of operation at a time of manufacturing the solid-state imaging device 11.

Figure 4:
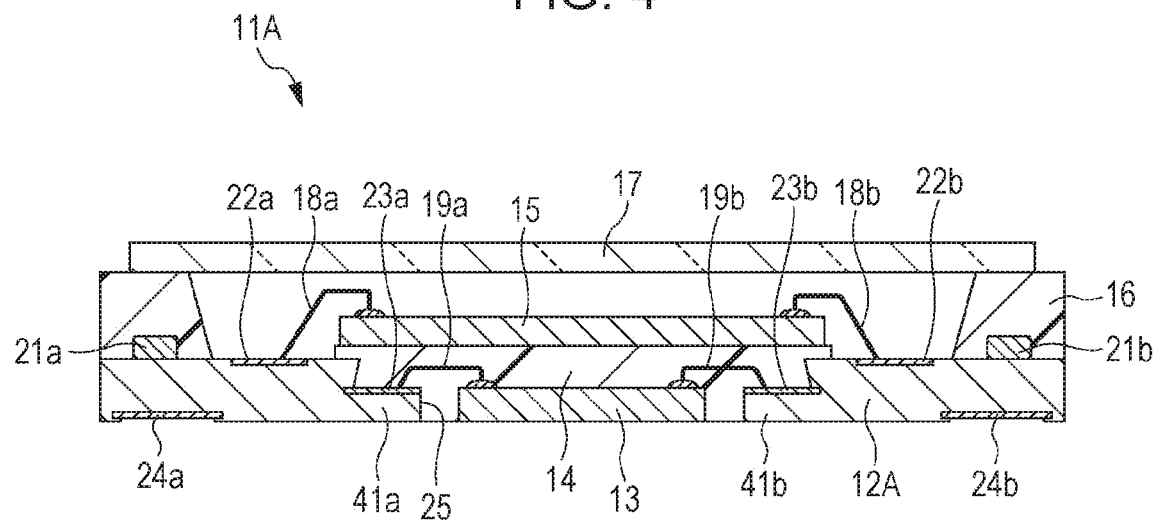
FIG. 4 is a view illustrating a configuration example of a second embodiment of the solid-state imaging device which employs the present technology.

Next, FIG. 4 is a view illustrating a configuration example of a second embodiment of the solid-state imaging device which employs the present technology.

In a solid-state imaging device 11A illustrated in FIG. 4, common constituent elements which are used in the solid-state imaging device 11 of FIG. 1 are given the same reference numerals, and detailed descriptions thereof will be omitted. In other words, the solid-state imaging device 11A is configured similarly to the solid-state imaging device 11 of FIG. 1 from the viewpoint that the semiconductor element 13 is sealed by the molding resin 14 in a state of being accommodated in the penetration portion 25, and the semiconductor element 13 and the solid-state imaging element 15 are layered via the molding resin 14.

However, from the viewpoint that step portions 41a and 41b are provided in the penetration portion 25 of an organic substrate 12A, and the inner leads 23a and 23b are respectively formed in the step portions 41a and 41b, the solid-state imaging device 11A has a configuration different from that of the solid-state imaging device 11 of FIG. 1. In other words, the step portions 41a and 41b are provided in the penetration portion 25 of the organic substrate 12A so that a part of the front surface of the organic substrate 12A becomes lower. For example, the step portions 41a and 41b are formed to have a thickness to the same extent as that of the semiconductor element 13, and the bonding wires 19a and 19b are respectively connected to the inner leads 23a and 23b.

By this configuration, in the solid-state imaging device 11A, it is possible to lower the height of the bonding wires 19a and 19b, which are used for a connection with the semiconductor element 13, to be lower than that in a configuration of the solid-state imaging device 11 of FIG. 1. In other words, in the solid-state imaging device 11A, the inner leads 23a and 23b are formed at a position which is lower than the front surface of the organic substrate 12A in which the inner leads 22a and 22b are formed. Therefore, for example, it is possible to have a configuration in which the bonding wires 19a and 19b are not protruded from the front surface of the organic substrate 12A. Accordingly, the solid-state imaging device 11A can be much thinner than the solid-state imaging device 11 of FIG. 1.

Figure 5:
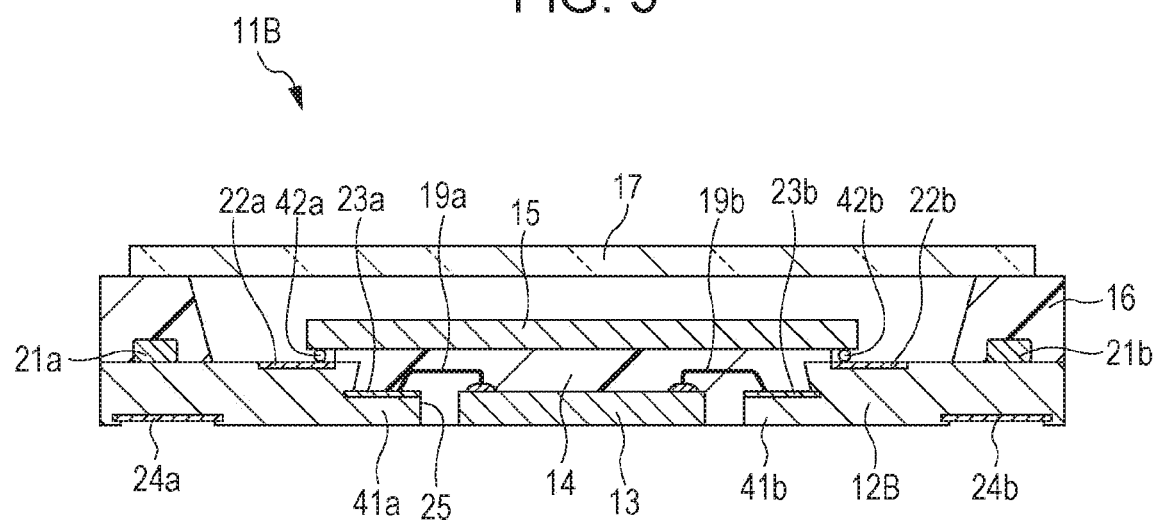
FIG. 5 is a view illustrating a configuration example of a third embodiment of the solid-state imaging device which employs the present technology.

Next, FIG. 5 is a view illustrating a configuration example of a third embodiment of the solid-state imaging device which employs the present technology.

In a solid-state imaging device 11B illustrated in FIG. 5, common constituent elements which are used in the solid-state imaging device 11A of FIG. 4 are given the same reference numerals, and detailed descriptions thereof will be omitted. In other words, the solid-state imaging device 11B is configured similarly to the solid-state imaging device 11A of FIG. 4 from the viewpoint that the semiconductor element 13 is sealed by the molding resin 14 in a state of being accommodated in the penetration portion 25, and the semiconductor element 13 and the solid-state imaging element 15 are layered via the molding resin 14, and the step portions 41a and 41b in which the inner leads 23a and 23b are formed are provided.

However, from the viewpoint that the solid-state imaging element 15 is connected to an organic substrate 12B via bumps 42a and 42b, the solid-state imaging device 11B has a configuration different from that of the solid-state imaging device 11 of FIG. 1. In other words, in the solid-state imaging device 11B, the solid-state imaging element 15 is flip-chip mounted on the organic substrate 12B.

By this configuration, the organic substrate 12B can be much thinner than the solid-state imaging devices 11 and 11A which have a configuration in which the solid-state imaging element 15 is connected by using the bonding wires 18a and 18b. In other words, in the solid-state imaging devices 11 and 11A, it is necessary to dispose the seal glass 17 to be as high as the bonding wires 18a and 18b. In contrast, the organic substrate 12B can dispose the seal glass 17 to be much closer than the solid-state imaging element 15, and thus it is possible to reduce the thickness.

In addition, the layered structure of the semiconductor element 13 and the solid-state imaging element 15 are not limited to only the configurations of the above-described first to the third embodiments. The solid-state imaging device 11 can employ other layered structures.

Figure 6:
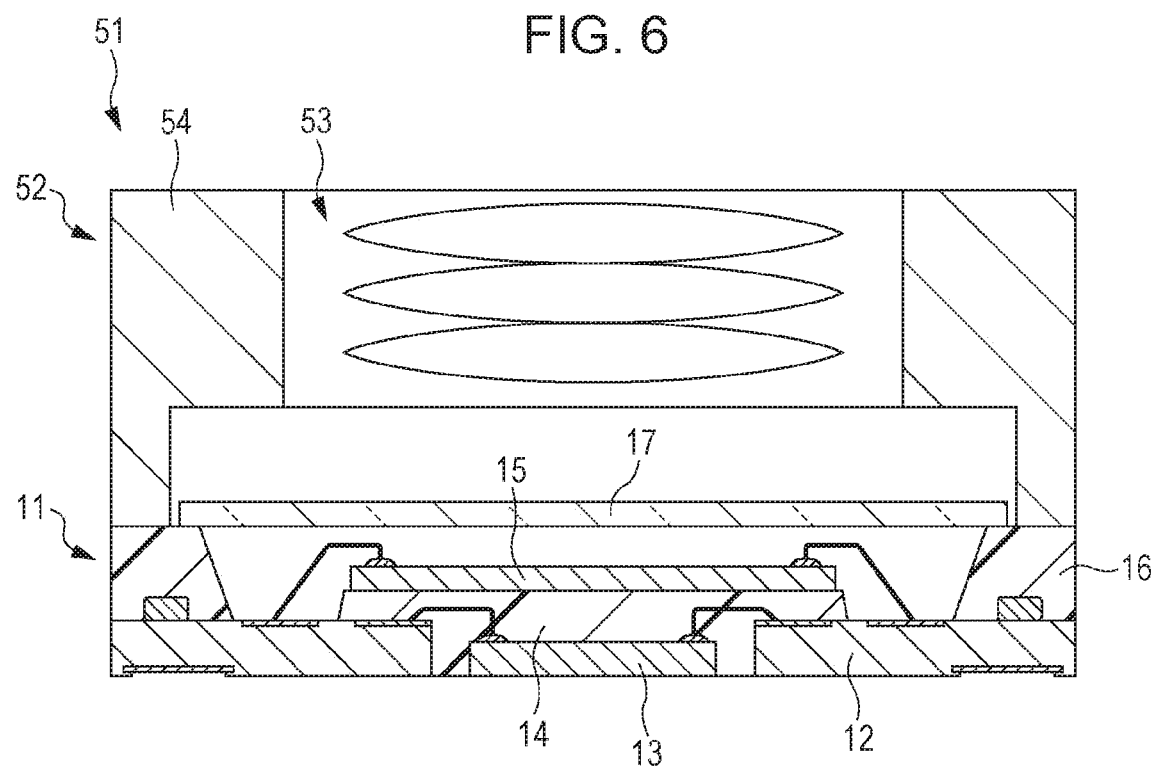
FIG. 6 is a view illustrating a configuration example of a camera module which is provided with the solid-state imaging device.

Next, FIG. 6 is a view illustrating a configuration example of a camera module which is provided with the solid-state imaging device 11.

As illustrated in FIG. 6, a camera module 51 is provided with the solid-state imaging device 11 and an optical unit 52. The optical unit 52 is provided with the optical system 53 which is configured by a plurality of lenses and a maintaining portion 54 which holds each lens of the optical system 53. The optical unit 52 is layered with respect to the molding resin 16 of the solid-state imaging device 11.

In the camera module 51 configured in this manner, as the above-described solid-state imaging device 11 is made thin, the height of the entire camera module 51 having this configuration can be lowered.

In addition, the solid-state imaging device 11 of each above-described embodiment can be employed in various types of electronic apparatuses, such as an imaging system including a digital still camera or a digital video camera, a mobile phone provided with a capturing function, or other apparatuses provided with the capturing function.

Figure 7:
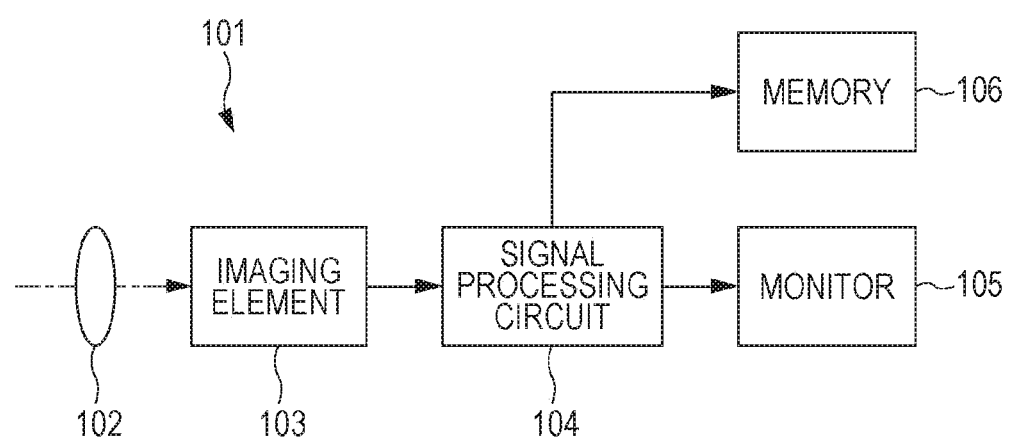
FIG. 7 is a block diagram illustrating a configuration example of an electronic apparatus.

FIG. 7 is a block diagram illustrating a configuration example of an imaging device which is installed in the electronic apparatus.

As described in FIG. 7, an imaging device 101 is provided with an optical system 102, an imaging element 103, a signal processing circuit 104, a monitor 105, and a memory 106, and is capable of capturing a still image and a moving image.

The optical system 102 has one or a plurality of lenses, guides image light (incident light) from an object to the imaging element 103, and forms an image on the light sensing surface (sensor portion) of the imaging element 103.

As the imaging element 103, the solid-state imaging device 11 of each of the above-described embodiments is employed. In the imaging element 103, electrons are accumulated for a certain period of time according to the image formed on the light sensing surface via the optical system 102. Then, a signal according to the electrons accumulated on the imaging element 103 is supplied to the signal processing circuit 104.

The signal processing circuit 104 performs various signal processings with respect to the image signal output from the imaging element 103. The image (image data) obtained as the signal processing circuit 104 performs the signal processing is supplied to and displayed on the monitor 105, and is supplied and stored (recorded) in the memory 106.

In the imaging device 101 having this configuration, as the solid-state imaging device 11 of each of the above-described embodiments is employed, for example, it is possible to obtain an image having much lower level of noise.

In addition, the present technology can also employ a configuration as follows.

(1)

A solid-state imaging device including: a solid-state imaging element which outputs an image signal according to an amount of light sensed on a light sensing surface; a semiconductor element which performs signal processing with respect to the image signal output from the solid-state imaging element; and a substrate which is electrically connected to the solid-state imaging element and the semiconductor element, in which the semiconductor element is sealed by a molding resin in a state of being accommodated in an accommodation area which is provided on the substrate, and in which the solid-state imaging element is layered on the semiconductor element via the molding resin.

(2)

The solid-state imaging device according to the above-described (1), in which the accommodation area is a penetration portion which is formed to penetrate the substrate.

(3)

The solid-state imaging device according to the above-described (2), in which, on the substrate, a mounting terminal which is used for a connection with an electronic apparatus that has the solid-state imaging device mounted thereon, is formed, and a part of the semiconductor element accommodated in the penetration portion is exposed on a surface side on which the mounting terminal is formed.

(4)

The solid-state imaging device according to the above-described (2) or (3), in which, on the substrate, inner leads to which a plurality of bonding wires used for electrically connecting the solid-state imaging device and the semiconductor element to each other is connected, are formed on a surface opposite to a surface on which the mounting terminal is formed.

(5)

The solid-state imaging device according to the above-described (4), in which, in the penetration portion formed on the substrate, a step portion which makes a part of a surface on a side where the inner leads are formed low is provided, and in which, in the step portion, the inner leads to which the bonding wires used for an electrical connection with the semiconductor element are connected are formed.

(6)

The solid-state imaging device according to any one of the above-described (1) to (3), in which the solid-state imaging element is flip-chip mounted on the substrate.

(7)

A manufacturing method of a solid-state imaging device which has: a solid-state imaging element which outputs an image signal according to an amount of light sensed on a light sensing surface; a semiconductor element which performs signal processing with respect to the image signal output from the solid-state imaging element; and a substrate which is electrically connected to the solid-state imaging element and the semiconductor element, including: sealing the semiconductor element using a molding resin in a state of being accommodated in an accommodation area which is provided on the substrate; and layering the solid-state imaging element on the semiconductor element via the molding resin.

(8)

An electronic apparatus including a solid-state imaging device that includes: a solid-state imaging element which outputs an image signal according to an amount of light sensed on a light sensing surface; a semiconductor element which performs signal processing with respect to the image signal output from the solid-state imaging element; and a substrate which is electrically connected to the solid-state imaging element and the semiconductor element, in which the semiconductor element is sealed by a molding resin in a state of being accommodated in an accommodation area which is provided on the substrate, and in which the solid-state imaging element is layered on the semiconductor element via the molding resin.

In addition, the embodiments of the present disclosure are not limited to the above-described embodiments, and it is possible to add various changes without departing from the scope of the present disclosure.

What is claimed is:

1. A camera module, comprising:
   a lens;
   a lens holder configured to hold the lens;
   a solid-state imaging element configured to receive light through the lens;
   a first substrate electrically connected to the solid-state imaging element via bonding wires and configured to receive an image signal output from the solid-state imaging element; and
   a second substrate electrically connected to the solid-state imaging element and the first substrate, wherein the solid-state imaging element is disposed above the second substrate, wherein the lens holder is attached to the second substrate via a first material,
   wherein the bonding wires are sealed by a second material in contact with the solid-state imaging element and the first substrate.

2. The camera module of claim 1, wherein the first material and the second material comprise resin.

3. The camera module of claim 1, wherein the bonding wires are attached at a periphery of the first substrate.

4. The camera module of claim 3, wherein the bonding wires are attached to the second substrate at locations on the second substrate that are further away from a center of the solid-state imaging element than the periphery of the first substrate.

5. The camera module of claim 1, wherein the second substrate is thicker than the first substrate.

6. The camera module of claim 1, wherein at least one section of the second substrate has a substantially same thickness as the first substrate.

7. The camera module of claim 6, wherein the at least one section is a step formed in the second substrate.

8. The camera module of claim 1, further comprising:
   a seal glass between the lens and the solid-state imaging element.

9. The camera module of claim 8, wherein the seal glass is supported by the first material.

10. The camera module of claim 1, wherein the first substrate is configured to perform signal processing with respect to the image signal output from the solid-state imaging element.

11. A camera module, comprising:
    a lens;
    a lens holder configured to hold the lens;
    a solid-state imaging element configured to receive light through the lens;
    a first substrate electrically connected to the solid-state imaging element via a connecting portion and configured to receive an image signal output from the solid-state imaging element; and
    a second substrate electrically connected to the solid-state imaging element and the first substrate via the connecting portion, wherein the solid-state imaging element is disposed above the second substrate, wherein the lens holder is attached to the second substrate via a first material,
    wherein the connecting portion comprises bonding wires, and
    wherein at least a part of the connecting portion is sealed by a second material in contact with the solid-state imaging element and the first substrate.

12. The camera module of claim 11, wherein the first material and the second material comprise resin.

13. The camera module of claim 11, wherein the bonding wires are attached at a periphery of the first substrate.

14. The camera module of claim 13, wherein the bonding wires are attached to the second substrate at locations on the second substrate that are further away from a center of the solid-state imaging element than the periphery of the first substrate.

15. The camera module of claim 11, wherein the second substrate is thicker than the first substrate.

16. The camera module of claim 11, wherein at least one section of the second substrate has a substantially same thickness as the first substrate.

17. The camera module of claim 16, wherein the at least one section is a step formed in the second substrate.

18. The camera module of claim 11, further comprising:
    a seal glass between the lens and the solid-state imaging element.

19. The camera module of claim 18, wherein the seal glass is supported by the first material.

20. The camera module of claim 11, wherein the first substrate is configured to perform signal processing with respect to the image signal output from the solid-state imaging element.

* * * * *